United States Patent
Cai et al.

(10) Patent No.: US 12,445,103 B2
(45) Date of Patent: **\*Oct. 14, 2025**

(54) SELECTIVE FILTERING FOR CONTINUOUS 5 GHz AND 6 GHz OPERATION OF A NETWORK DEVICE

(71) Applicant: Hewlett Packard Enterprise Development LP, Spring, TX (US)

(72) Inventors: Kehui Cai, Beijing (CN); Hongli Zhang, Beijing (CN); Farhan Hasnain, San Jose, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 513 days.

This patent is subject to a terminal disclaimer.

(21) Appl. No.: 17/931,394

(22) Filed: Sep. 12, 2022

(65) Prior Publication Data

US 2023/0006630 A1 Jan. 5, 2023

Related U.S. Application Data

(63) Continuation of application No. 16/924,245, filed on Jul. 9, 2020, now Pat. No. 11,476,824.

(51) Int. Cl.
*H03H 9/00* (2006.01)
*H03H 3/02* (2006.01)
*H03H 9/70* (2006.01)

(52) U.S. Cl.
CPC ............ *H03H 9/0095* (2013.01); *H03H 3/02* (2013.01); *H03H 9/703* (2013.01); *H03H 2003/021* (2013.01)

(58) Field of Classification Search
CPC ........ H03H 9/0095; H03H 9/703; H03H 3/02; H03H 2003/021
See application file for complete search history.

(56) References Cited

U.S. PATENT DOCUMENTS

| 5,020,093 A | 5/1991 | Pireh |
| 9,306,603 B2 | 4/2016 | Lee et al. |

(Continued)

FOREIGN PATENT DOCUMENTS

| CN | 110324053 A | 10/2019 |
| CN | 110581718 A | 12/2019 |

(Continued)

OTHER PUBLICATIONS

Federal Communications Commission FCC 18-147, Oct. 24, 2018, p. 10505 (https://www.fcc.gov/document/fcc-proposes-more-spectrum-unlicensed-use-0) (Year: 2018).

(Continued)

*Primary Examiner* — Elton Williams
(74) *Attorney, Agent, or Firm* — Hewlett Packard Enterprise Patent Department (57) ABSTRACT

Examples described herein provide selective filtering by a network device for continuous 5 GHz and 6 GHz operation. Examples may include receiving, by the network device, a first signal in a 5 GHz band, and generating, by the network device, a second signal in a 6 GHz band. Examples may include selecting, by the network device, a first filter or a second filter to be applied the first signal in the 5 GHz band, wherein the first filter allows a lower frequency band to pass than the second filter in the 5 GHz band, selecting, by the network device, a third filter or a fourth filter to be applied to the second signal in the 6 GHz band, wherein the third filter allows a lower frequency band to pass than the fourth filter in the 6 GHz band, and simultaneously applying, by the network device, the selected first or second filter to the first signal and the selected third or fourth filter to the second signal.

19 Claims, 5 Drawing Sheets

(56) References Cited

U.S. PATENT DOCUMENTS

| | | |
|---|---|---|
| 9,991,909 B2 | 6/2018 | Watanabe |
| 10,027,287 B1 | 7/2018 | Ichitsubo et al. |
| 10,720,971 B2 | 7/2020 | Liu et al. |
| 11,102,790 B2 | 8/2021 | Har-Zion et al. |
| 11,196,451 B2 | 12/2021 | Hanaoka |
| 11,356,127 B2 * | 6/2022 | Hasnain .................. H04B 1/44 |
| 11,476,824 B2 * | 10/2022 | Cai ........................ H04B 1/005 |
| 2007/0242785 A1 | 10/2007 | Thudor et al. |
| 2010/0157858 A1 | 6/2010 | Lee et al. |
| 2010/0260082 A1 | 10/2010 | Lum et al. |
| 2012/0243449 A1 | 9/2012 | He |
| 2012/0280840 A1 | 11/2012 | Kyeong et al. |
| 2013/0273861 A1 | 10/2013 | See |
| 2014/0119259 A1 | 5/2014 | Nilsson et al. |
| 2014/0197902 A1 | 7/2014 | Zuo et al. |
| 2014/0218255 A1 | 8/2014 | Sanford et al. |
| 2015/0311946 A1 | 10/2015 | Khan et al. |
| 2017/0005679 A1 | 1/2017 | Yang et al. |
| 2017/0163293 A1 | 6/2017 | Lee et al. |
| 2017/0222665 A1 | 8/2017 | Chang et al. |
| 2018/0368082 A1 | 12/2018 | O'Shea et al. |
| 2019/0306805 A1 | 10/2019 | Hasnain et al. |
| 2019/0364566 A1 | 11/2019 | Husted et al. |
| 2020/0077412 A1 | 3/2020 | Har-Zion et al. |
| 2020/0195230 A1 | 6/2020 | Nosaka |
| 2020/0252042 A1 | 8/2020 | Mori et al. |
| 2020/0328764 A1 | 10/2020 | Ge et al. |
| 2021/0144729 A1 | 5/2021 | Kim et al. |
| 2021/0159925 A1 | 5/2021 | Mori |
| 2021/0184707 A1 | 6/2021 | Hasnain |

FOREIGN PATENT DOCUMENTS

| | | |
|---|---|---|
| CN | 111355512 A | 6/2020 |
| WO | 2018/223049 A1 | 12/2018 |
| WO | 2019/040092 A1 | 2/2019 |
| WO | 2020/049423 A1 | 3/2020 |

OTHER PUBLICATIONS

Federal Register/vol. 79, No. 84/Thursday, May 1, 2014/ Rules and Regulations / p. 24579 (https://www.govinfo.gov/content/pkg/FR-2014-05-01/pdf/2014-09279.pdf) (Year: 2014).

Federal Register/vol. 85, No. 25 / Thursday, Feb. 6, 2020 / Proposed Rules / p. 6843 (https://www.govinfo.gov/content/pkg/FR-2020-02-06/pdf/2020-02086.pdf) (Year: 2020).

Nguyen, New Rules for Unlicensed National Information Infrastructure (U-NII) Bands (https://transition.fcc.gov/bureaus/oet/ea/presentations/files/oct14/51-New-Rules-for-UNII-Bands,-Oct-2014-TN.pdf) (Year: 2014).

Wesley J. Boyd, "Next Generation Wi-Fi: 6 GHz is on the Horizon", Technical Article, Skyworks Solutions, Inc., 2020, pp. 1-4.

* cited by examiner

SELECTIVE FILTERING FOR CONTINUOUS 5 GHz AND 6 GHz OPERATION OF A NETWORK DEVICE

CROSS-REFERENCE TO RELATED APPLICATIONS

This application is related to a co-pending U.S. application titled "Selective Filtering for Continuous 5 GHz and GHz Operation of a Network Device," filed on Dec. 16, 2019 (U.S. application Ser. No. 16/715,173), and is assigned to Hewlett Packard Enterprise Development LP.

BACKGROUND

The Unlicensed National Information Infrastructure (U-NII) radio band is a part of the unlicensed radio frequency (RF) spectrum used by IEEE 802.11 devices and wireless internet service providers (ISPs) for Wi-Fi communications. Currently, U-NII allocates Wi-Fi channels in the 5 GHz band across four sub-bands: U-NII-1 (5.150 to 5.250 GHz), U-NII-2 (5.250 GHz to 5.725 GHz), U-NII-3 (5.725 GHz to 5.850 GHz), and U-NII-4 (5.850 GHz to 5.925 GHz).

Recently, there have been efforts to include the 6 GHz band for Wi-Fi communications. For instance, it has been proposed to allocate Wi-Fi channels in the 6 GHz U-NII radio band across four sub-bands: U-NII-5 (5.945 to 6.425 GHz), U-NII-6 (6.425 GHz to 6.525 GHz), U-NII-7 (6.525 GHz to 6.875 GHz), and U-NII-8 (6.875 GHz to 7.125 GHz). Such channel allocation in the 6 GHz band would greatly increase the number of available channels for Wi-Fi communications, especially as currently available Wi-Fi bands (e.g., 2.4 GHz, 5 GHz) become increasingly congested from usage by ISPs and wireless local area networks (WLANs). Moreover, such channel allocation in the 6 GHz band brings the possibility of higher aggregated throughput across all Wi-Fi bands.

BRIEF DESCRIPTION OF THE DRAWINGS

Various features and advantages of the invention will become apparent from the following description of examples of the invention, given by way of example only, which is made with reference to the accompanying drawings, of which.

DETAILED DESCRIPTION

Despite the great potential that the 6 GHz band offers for increasing channel availability and throughput for Wi-Fi communications, Wi-Fi channel allocation in the 6 GHz band may create co-existence issues with existing 5 GHz Wi-Fi channels. For instance, when a network device simultaneously operates both a 5 GHz radio using the 5 GHz U-NII channel allocation and a 6 GHz radio using the proposed U-NII 6 GHz channel allocation, jamming and interference may occur for certain Wi-Fi channels within the 5 GHz and 6 GHz bands. Specifically, when the network device receives a signal in a Wi-Fi channel at or near an upper bound of the 5 GHz band while generating another signal in a Wi-Fi channel at or near a lower bound of the 6 GHz band (or alternatively, when the network device receives a signal in a Wi-Fi channel at or near a lower bound of the 6 GHz band while generating another signal in a Wi-Fi channel at or near an upper bound of the 5 GHz band), the received signal may experience jamming and interference from the generated signal, thereby resulting in de-sensitization (e.g., shorter coverage range) and signal quality degradation (e.g., lower throughput) of the received signal. Moreover, existing RF filtering technologies require a wide transition bandwidth (e.g., 250 MHz or more) between passband filters for 5 GHz and 6 GHz bands to achieve a minimum dB rejection (e.g., at least 50 dB) required to mitigate such jamming and interference. As a result, existing RF filtering techniques do not adequately address 5 GHz and 6 GHz Wi-Fi channel co-existence issues for a network device when a narrow transition bandwidth (e.g., 200 MHz) is required between Wi-Fi channels at or near the bounds of the 5 GHz and 6 GHz bands. In addition, existing RF filtering techniques may limit the combinations of Wi-Fi channels in the 5 GHz and 6 GHz bands that may be used during continuous 5 GHz and 6 GHz operation by a network device.

To address these issues, examples described herein provide selective filtering for continuous 5 GHz and 6 GHz operation by a network device. Examples described herein may receive, by the network device, a first signal in a 5 GHz band, and generate, by the network device, a second signal in a 6 GHz band. Examples herein may select, by the network device, a first filter or a second filter to be applied the first signal in the 5 GHz band, wherein the first filter allows a lower frequency band to pass than the second filter in the 5 GHz band. Examples herein may select, by the network device, a third filter or a fourth filter to be applied to the second signal in the 6 GHz band, wherein the third filter allows a lower frequency band to pass than the fourth filter in the 6 GHz band. Example herein may simultaneously apply, by the network device, the selected first or second filter to the first signal and the selected third or fourth filter to the second signal.

In this manner, examples described herein may provide selective filtering by a network device for continuous 5 GHz and 6 GHz operation. For instance, in such examples, a network device may select a first filter or a second filter to be applied to a first signal in the 5 GHz band, wherein the first filter allows a lower frequency band to pass than the second filter in the 5 GHz, select a third filter or a fourth filter to be applied to a second signal in the 6 GHz band, wherein the third filter allows a lower frequency band to pass than the fourth filter in the 6 GHz band, and simultaneously apply the selected first or second filter to the first signal in the 5 GHz band and the selected third or fourth filter to the second signal in the 6 GHz band. Such selective filtering of the 5 GHz and 6 GHz bands allows a narrow transition gap (e.g., 200 MHz) to be maintained between Wi-Fi channels at or near an upper bound of the 5 GHz band and a lower bound of the 6 GHz band, while still achieving a minimum dB rejection (e.g., at least 50 dB) to mitigate jamming and interference of received signals in such Wi-Fi channels. Accordingly, examples described herein may prevent desensitization and degradation of a received 5 GHz signal in the presence of a generated 6 GHz signal (or a received 6 GHz signal in the presence of a generated 5 GHz signal) by a network device across wider frequency band ranges in the 5 GHz and 6 GHz bands, and may allow greater channel availability and higher aggregated throughput for continuous 5 GHz and 6 GHz operation. In addition, examples described herein may allow more combinations of Wi-Fi channels in the 5 GHz and 6 GHz bands to be used during continuous 5 GHz and 6 GHz operation by a network device.

Figure 1:
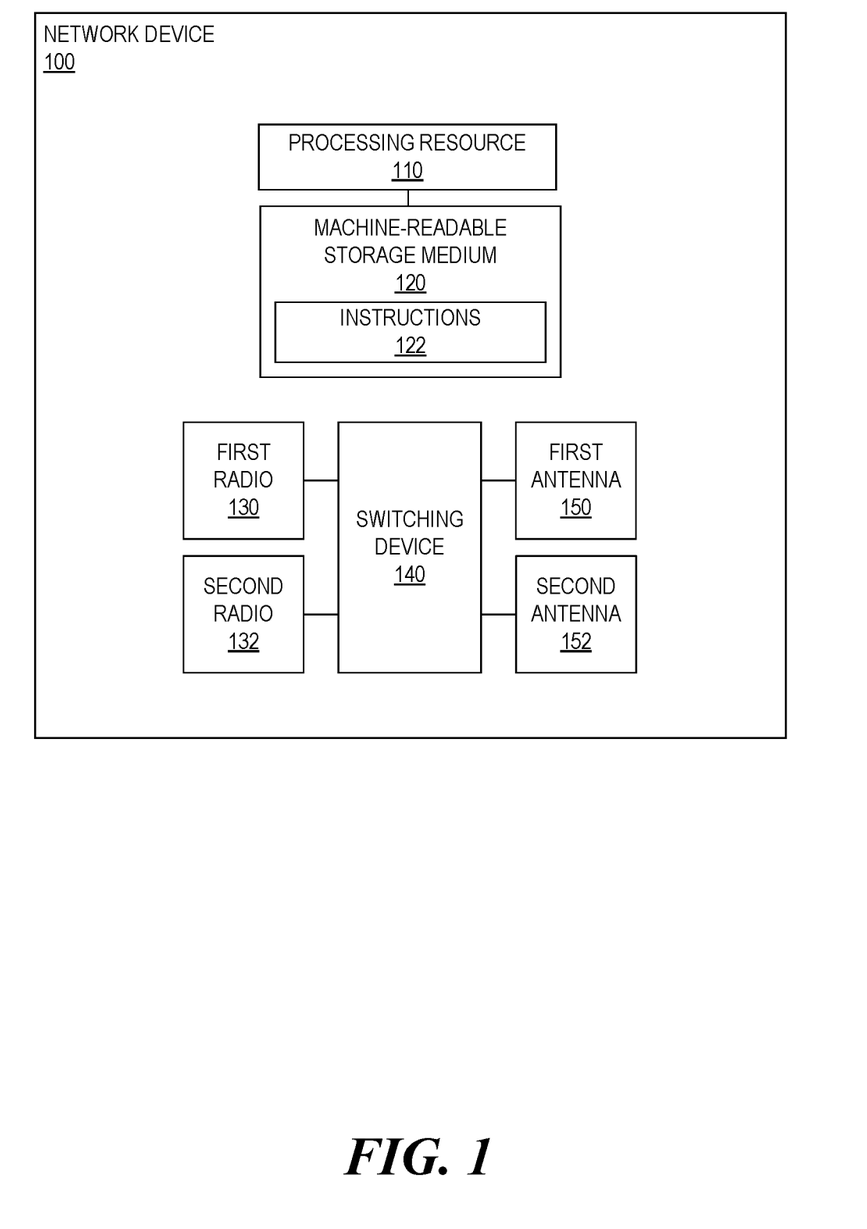
FIG. 1 is a block diagram of an example network device 100 for continuous 5 GHz and 6 GHz operation by selective filtering.

Referring now to the drawings, FIG. 1 is a block diagram of an example network device 100 for continuous 5 GHz and 6 GHz operation by selective filtering. Network device 100 includes at least one processing resource 110 and at least one machine-readable medium 120 comprising (e.g., encoded with) at least instructions 122 that are executable by the at least one processing resource 110 of network device 100 to implement functionalities described herein in relation to instructions 122.

In the example of FIG. 1, network device 100 may engage in any network data transmission operations, including, but not limited to, switching, routing, bridging, or a combination thereof. In some examples, network device 100 may comprise a wireless access point (WAP). In examples described herein, a "WAP" generally refers to receiving points for any known or convenient wireless access technology which may later become known. Specifically, the term WAP is not intended to be limited to WAPs which conform to IEEE 802.11 standards. A WAP generally functions as an electronic device that is adapted to allow wireless devices to connect to a wired network via various communications standards. A WAP may include any necessary hardware components to perform the inventions disclosed herein, including, but not limited to: processors, memories, display devices, input devices, communications equipment, etc. It will be understood by one of ordinary skill in the art that network device 100 may be any suitable type(s) of network devices made by any suitable manufacturer(s).

In the example of FIG. 1, network device 100 includes a first radio 130 and a second radio 132. In some examples, each of first radio 130 and second radio 132 may operate at one or more frequency bands which conform one or more IEEE standards (e.g., 802.11ax). In some examples, first radio 130 may operate at one or more channels in the 5 GHz band. For instance, first radio 130 may operate at one or more channels across the U-NII-1, U-NII-2, U-NII-3, and U-NII-4 sub-bands. In some examples, second radio 132 may operate at one or more channels in the 6 GHz band. For instance, second radio 132 may operate at one or more channels across the proposed U-NII-5, U-NII-6, U-NII-7, and U-NII-8 sub-bands. It will be understood by one skilled in the art that first radio 130 and second radio 132 may operate at any suitable frequency band(s) and conform to any suitable type(s) of wireless communication standards, now known and later developed. Moreover, although FIG. 1 shows network device 100 comprising two radios, it will be understood by one skilled in the art that network device 100 may comprise four, eight, or any suitable number of radios.

In the example of FIG. 1, network device includes a first antenna 150 and a second antenna 152. In some examples, each of first antenna 150 and second antenna 152 may transmit and/or receive directional signals, omnidirectional signals, or a combination thereof. In examples described herein, a "directional" signal refers to a signal which radiates more strongly in one or more directions as compared to one or more other directions along an azimuth plane (i.e., horizontal plane), whereas an "omnidirectional" signal refers to a signal which radiates equally in all directions along an azimuth plane. In some examples, each of first antenna 150 and second antenna 152 may comprise a phased array antenna. In examples described herein, a "phased array antenna" refers to an array of antenna elements which can create a directional signal which can be electronically steered to point in different directions without moving the antenna elements. In such examples, a phased array antenna may comprise an array of directional and/or omnidirectional antenna elements which can focus (i.e., transmit, receive) RF energy in specific spatial directions. It will be understood by on skilled in the art that first antenna 150 and second antenna 152 may comprise any suitable type(s) of antenna, now known and later developed. Moreover, although FIG. 1 shows network device 100 comprising two antennas, it will be understood by one skilled in the art that network device 100 may comprise four, eight, or any suitable number of antennas.

In the example of FIG. 1, network device 100 includes a switching device 140. In some examples, switching device 140 may be connected to first radio 130, second radio 132, first antenna 150, and second antenna 152. In some examples, switching device 140 may comprise one or more switches which are connected to one or more of first radio 130, second radio 132, first antenna 150, and second antenna 152. In some examples, switching device 140 may comprise one or more filters which are connected to one or more of first radio 130, second radio 132, first antenna 150, and second antenna 152.

In the example of FIG. 1, instructions 122 may be configured to receive a first signal in one of a 5 GHz band and a 6 GHz band. In some examples, first signal may be received by first antenna 150 of network device 100.

In the example of FIG. 1, instructions 122 may be configured to generate a second signal in the other one of the 5 GHz and 6 GHz bands. In some examples, the second signal may be generated by second radio 132 of network device 100, wherein second radio 132 operates at the other one of the 5 GHz and 6 GHz bands.

In the example of FIG. 1, instructions 122 may be configured to select a first filter or a second filter to be applied to the one of the first and second signals in the 5 GHz band, wherein the first filter allows a lower frequency band to pass than the second filter in the 5 GHz band. In some examples, the first or second filter may be selected by switching device 140. In some examples, the first or second filter may be selected by a first switch of switching device 140. In some examples, the first or second filter may be selected in response to instructions received by network device 100 from a controller device. For instance, the instructions received by network device 100 from the controller device may indicate a channel in the 5 GHz band which corresponds to one of the first or second filters, and the first or second filter may be selected based on (e.g., in response to) the indicated channel.

In some examples, the first filter may allow a frequency band in the range of 5150 to X MHz to pass, and the second filter may allow a frequency band in the range of X to 5895 MHz to pass, wherein X is a frequency between 5150 to 5895 MHz. For instance, X may be selected to satisfy Equations (1) and (2) below:

$$(|\text{gap between 5 GHz and 6 GHz bands}|)+(5895-X) \geq R \quad \quad \text{Equation (1):}$$

$$(5895-X)=nB_1 \quad \quad \text{Equation (2):}$$

Referring to Equations (1) and (2), the gap between the 5 GHz and 6 GHz bands refers to a difference between the upper bound of the highest available 5 GHz channel and the lower bound of the lowest available 6 GHz channel for Wi-Fi communications by network device 100. In some examples, the upper bound of the highest available 5 GHz channel may correspond to the upper stop frequency of the passband of the second filter (i.e., the highest frequency within the frequency band that the second filter allows to pass) and the lower bound of the lowest available 6 GHz channel may correspond to the lower stop frequency of the passband of the third filter (i.e., the lowest frequency within the frequency band that the third filter allows to pass). Moreover, R refers to a minimum transition gap between the passband of the second filter and the passband of the third filter. For instance, R may correspond to the gap between the upper stop frequency of the passband of the second filter and a lower stop frequency of the passband of the third filter. R may be determined based on the capabilities of the second and third filters (e.g., filter type, filter specifications, etc.). In addition, as noted above, X is a frequency between 5150 to 5895 MHz. Furthermore, n is an integer greater than zero, and $B_1$ refers to the widest channel bandwidth in the 5 GHz band (e.g., 160 MHz) for Wi-Fi communications by network device 100. In other words, in accordance with Equation (2), X is selected such that the value of (5895−X) is an integer multiple n of the widest channel bandwidth $B_1$ in the 5 GHz band for Wi-Fi communications by network device 100.

In examples described herein, a "passband" of a filter (e.g., first filter, second filter, etc.) refers to a frequency band which the filter allows to pass (e.g., transmit) when the filter is applied to a given signal (e.g., first signal, second signal, etc.).

It will be understood by one skilled in the art that the first filter and the second filter may allow any suitable frequency bands to pass in the 5 GHz band, and that a plurality of Wi-Fi channels may correspond to each frequency band.

In the example of FIG. 1, instructions 122 may be configured to select a third filter or a fourth filter to be applied to the other one of the first and second signals in the 6 GHz band, wherein the third filter allows a lower frequency band to pass than the fourth filter in the 6 GHz band. In some examples, the third or filter may be selected by switching device 140. In some examples, the third or fourth filter may be selected by a second switch of switching device 140. In some examples, the third or fourth filter may be selected in response to instructions received by network device 100 from a controller device. For instance, the instructions received by network device 100 from the controller device may indicate a channel in the 6 GHz band which corresponds to one of the third or fourth filters, and the third or fourth filter may be selected in response to the indicated channel.

In some examples, the third filter may allow a frequency band in the range of 5945 to Y MHz to pass, and the fourth filter may allow a frequency band in the range of Y to 7125 MHz to pass, wherein Y is a frequency between 5945 to 7125 MHz. For instance, Y may be selected to satisfy Equations (3) and (4) below:

$$(|\text{gap between 5 GHz and 6 GHz bands}|)+(Y-5945) \geq R \quad \text{Equation (3):}$$

$$(Y-5945)=mB_2 \quad \text{Equation (4):}$$

Referring to Equations (3) and (4), the gap between the 5 GHz and 6 GHz bands refers to a difference between the upper bound of the highest available 5 GHz channel and the lower bound of the lowest available 6 GHz channel for Wi-Fi communications by network device 100 (as described above in relation to Equation (1)). Moreover, R refers to the minimum transition gap between the passband of the second filter and the passband of the third filter (as described above in relation to Equation (1)). In addition, as noted above, Y is a frequency between 5945 to 7125 MHz. Furthermore, m is an integer greater than zero, and $B_2$ refers to the widest channel bandwidth in the 6 GHz band (e.g., 160 MHz) for Wi-Fi communications by network device 100. In other words, in accordance with Equation (4), Y is selected such that the value of (Y−5945) is an integer multiple m of the widest channel bandwidth $B_2$ in the 6 GHz band for Wi-Fi communications by network device 100.

It will be understood by one skilled in the art that the third filter and the fourth filter may allow any suitable frequency bands to pass in the 6 GHz band, and that a plurality of Wi-Fi channels may correspond to each frequency band.

In the example of FIG. 1, instructions 122 may be configured to apply the selected first or second filter to the first signal and the selected third or fourth filter to the second signal. In some examples, the selected first or second filter may be applied to the first signal by switching device 140, and the selected third or fourth filter may be applied to the second signal by switching device 140. In some examples, the filtered first signal may be selected by a third switch of switching device 140, and the filtered second signal may be selected by a fourth switch of switching device 140. In some examples, the third switch may be connected to first antenna 150 of network device 100, and the fourth switch may be connected to second antenna 152 of network device 100. In some examples, the second filter may achieve at least a 50 dB rejection in a transition gap of 200 MHz. In some examples, the third filter may achieve at least a 50 dB rejection in a transition gap of 200 MHz. It will be understood by one skilled in the art that the second and third filters may achieve greater or lesser dB rejection(s) within wider or narrower transition gap(s).

In the example of FIG. 1, network device 100 may prevent interference and jamming of a received first signal from a generated second signal that is in the vicinity of the received first signal. For instance, when a received first signal is in the 5 GHz band and a generated second signal is in the 6 GHz band, network device 100 may prevent interference in the received 5 GHz signal from the generated 6 GHz signal by applying the third or fourth filter to the generated 6 GHz signal. Moreover, network device 100 may prevent jamming of the received 5 GHz signal from the generated 6 GHz signal by applying the first or second filter to the received 5 GHz signal. That is, by applying the first or second filter to the received 5 GHz signal, network device 100 may prevent jamming of the received 5 GHz signal from the generated 6 GHz signal by filtering an undesired coupling of the generated 6 GHz signal to the received 5 GHz signal. Alternatively, when the received first signal is in the 6 GHz band and the generated second signal is in the 5 GHz band, network device 100 may prevent interference in the received 6 GHz signal by applying the first or second filter to the generated 5 GHz signal. Moreover, network device 100 may prevent jamming of the received 6 GHz signal from the generated 5 GHz signal by applying the third or fourth filter to the received 6 GHz signal. That is, by applying the third or fourth filter to the received 6 GHz signal, network device 100 may prevent jamming of the received 6 GHz signal from the generated 5 GHz signal by filtering an undesired coupling of the generated 5 GHz signal to the received 6 GHz signal.

In the example of FIG. 1, instructions 122 may be configured to process the filtered first signal. In some examples, the filtered first signal may be processed by first radio 130 of network device 100. In some examples, first radio 130 may operate at the one of the 5 GHz and 6 GHz bands.

In the example of FIG. 1, instructions 122 may be configured to transmit the filtered second signal. In some examples, the filtered second signal may be transmitted by second antenna 152 of network device 100.

In this manner, the example network device 100 of FIG. 1 may provide continuous 5 GHz and 6 GHz operation by selective filtering. For instance, network device 100 may be configured to select a first filter or a second filter to be applied to a signal in the 5 GHz band, wherein the first filter allows a lower frequency band to pass than the second filter in the 5 GHz band, select a third filter or a fourth filter to be applied to another signal in the 6 GHz band, wherein the third filter allows a lower frequency band to pass than the fourth filter in the 6 GHz band, and apply the selected first or second filter to the signal in the 5 GHz band and the selected third or fourth filter to the signal in the 6 GHz band, thereby allowing a narrow transition gap (e.g., 200 MHz) to be maintained between Wi-Fi channels at or near an upper bound of the 5 GHz band and a lower bound of the 6 GHz band during continuous 5 GHz and 6 GHz operation, while still achieving a minimum dB rejection (e.g., at least 50 dB) required to mitigate jamming and interference of received signals in such Wi-Fi channels. Thus, the selective filtering of the example network device 100 of FIG. 1 may prevent de-sensitization and degradation of a received 5 GHz signal in the presence of a generated 6 GHz signal (or a received 6 GHz signal in the presence of a generated 5 GHz signal) across wider frequency band ranges in the 5 GHz and 6 GHz bands, and may provide greater channel availability and higher aggregated throughput for continuous 5 GHz and 6 GHz operation. In addition, the selective filtering of the example network device of FIG. 1 may allow more combinations of Wi-Fi channels in the 5 GHz and 6 GHz bands to be used during continuous 5 GHz and 6 GHz operation by the network device.

Figure 2:
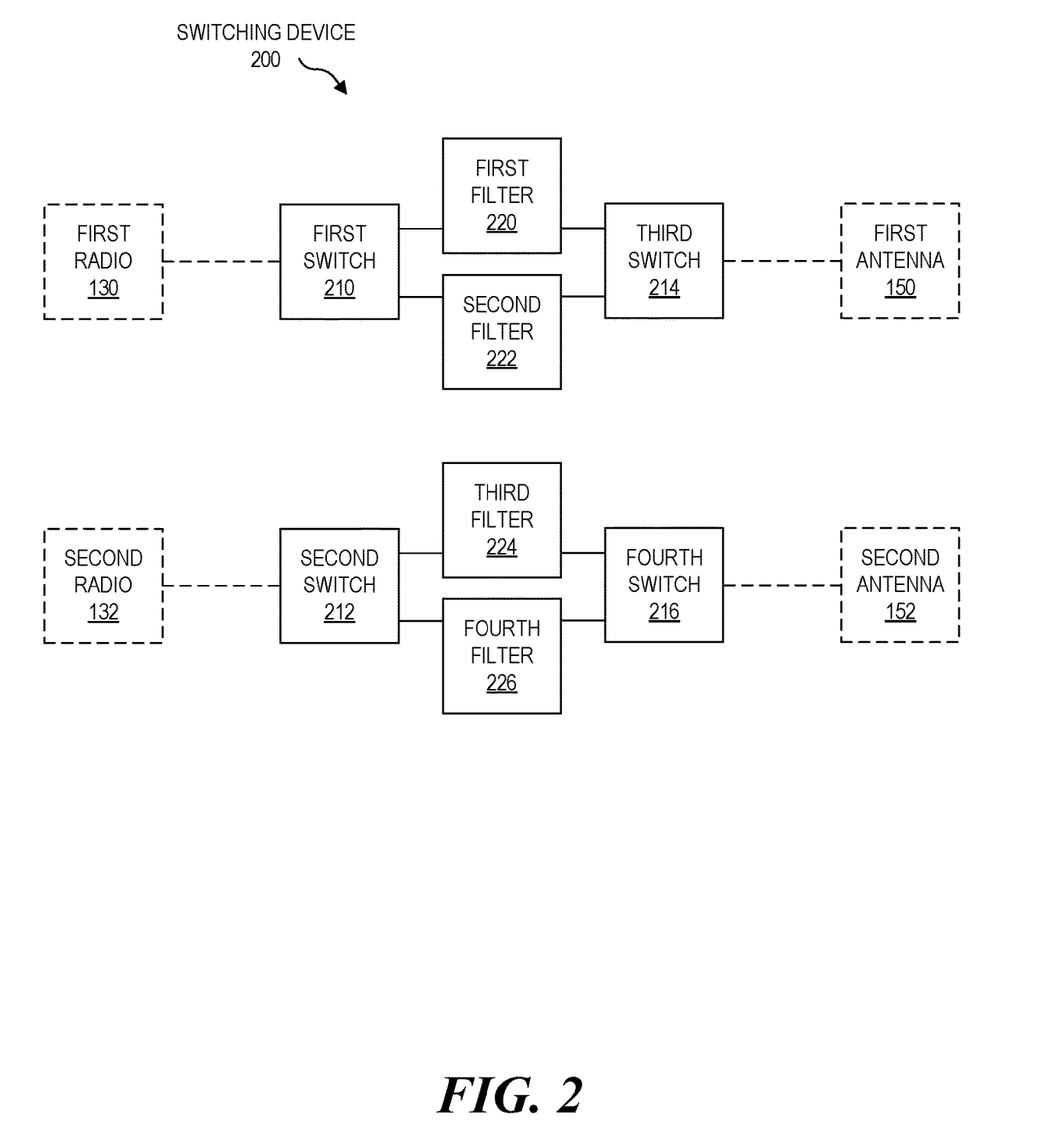
FIG. 2 is a block diagram of an example switching device 200 for continuous 5 GHz and 6 GHz operation by selective filtering.

FIG. 2 is a block diagram of an example switching device 200 for selective filtering for continuous 5 GHz and 6 GHz operation. Switching device 200 includes a first switch 210, a second switch 212, a third switch 214, and a fourth switch 216. In addition, switching device 200 includes a first filter 220, a second filter 222, a third filter 224, and a fourth filter 226. In the example of FIG. 2, each of the first, second, third, and fourth switches 210, 212, 214, and 216 may comprise a single-pole, double-throw (SP2T) switch. It will be understood by one skilled in the art that first, second, third, and fourth switches 210, 212, 214, and 216 may comprise any suitable type(s) of switches, now known or later developed. In the example of FIG. 2, each of first, second, third, and fourth filters 220, 222, 224, and 226 may comprise a low temperature co-fired ceramic (LTCC) filter, a dielectric cavity resonance (DR) filter, a surface acoustic wave (SAW) filter, a bulk acoustic wave (BAW) filter, or a combination thereof. It will be understood by one skilled in the art that first, second, third, and fourth filters 220, 222, 224, and 226 may comprise any suitable type(s) of filters, now known or later developed.

In the example of FIG. 2, switching device 200 may be connected to a network device. In some examples, switching device 200 may be connected to switches and filters of the network device. In some examples, first switch 210 may be connected to first radio 130 of network device 100, second switch 212 may be connected to second radio 132 of network device 100, third switch 214 may be connected to first antenna 150 of network device 100, and fourth switch 216 may be connected to second antenna 152 of network device 100.

In the example of FIG. 2, switching device 200 may receive a signal in the 5 GHz band ("5 GHz signal") from a network device. In some examples, the 5 GHz signal may be received by first switch 210. Alternatively, in some examples, the 5 GHz signal may be received by third switch 214. In some examples, the 5 GHz signal may be received from first radio 130 of network device 100. Alternatively, in some examples, the 5 GHz signal may be received from first antenna 150 of network device 100.

In the example of FIG. 2, switching device 200 may receive another signal in the 6 GHz band ("6 GHz signal") from a network device. In some examples, the 6 GHz signal may be received by second switch 212. Alternatively, in some examples, the 6 GHz signal may be received by fourth switch 216. In some examples, the 6 GHz signal may be received from second radio 132 of network device 100. Alternatively, in some examples, the 6 GHz signal may be received from second antenna 152 of network device 100.

In the example of FIG. 2, switching device 200 may select first filter 220 or second filter 222 to be applied to the 5 GHz signal, wherein first filter 220 allows a lower frequency band to pass than second filter 222 in the 5 GHz band. In some examples, first filter 220 or second filter 222 may be selected by first switch 210. Alternatively, in some examples, first filter 220 or second filter 222 may be selected by third switch 214. In some examples, the first or second filter may be selected in response to instructions received by the switching device from a controller device. For instance, the instructions received by the switching device from the controller device may indicate a channel in the 5 GHz band which corresponds to one of the first or second filters, and the first or second filter may be selected based on (e.g., in response to) the indicated channel.

In the example of FIG. 2, switching device 200 may select third filter 224 or fourth filter 226 to be applied to the 6 GHz signal, wherein third filter 224 allows a lower frequency band to pass than fourth filter 226 in the 6 GHz band. In some examples, third filter 224 or fourth filter 226 may be selected by second switch 212. Alternatively, in some examples, third filter 224 or fourth filter 226 may be selected by fourth switch 216. In some examples, the third or fourth filter may be selected in response to instructions received by the switching device from a controller device. For instance, the instructions received by the switching device from the controller device may indicate a channel in the 6 GHz band which corresponds to one of the third or fourth filters, and the third or fourth filter may be selected based on (e.g., in response to) the indicated channel.

In some examples, first filter 220 may allow a frequency band in the range of 5150 to X MHz to pass, and second filter 222 may allow a frequency band in the range of X to 5895 MHz to pass, wherein X is a frequency between 5150 and 5895 MHz. For instance, X may be selected to satisfy Equations (1) and (2) above. In some examples, third filter 224 may allow a frequency band in the range of 5945 to Y MHz to pass, and fourth filter 226 may allow a frequency band in the range of Y to 7125 MHz to pass, wherein Y is a frequency between 5945 to 7125 MHz. For instance, Y may be selected to satisfy Equations (3) and (4) above.

In the example of FIG. 2, switching device 200 may apply the selected first filter 220 or second filter 222 to the 5 GHz signal and the selected third filter 224 or fourth filter 226 to the 6 GHz signal. In some examples, second filter 222 may achieve at least a 50 dB rejection in a transition gap of 200 MHz. In some examples, third filter 224 may achieve at least a 50 dB rejection in a transition gap of 200 MHz.

In the example of FIG. 2, switching device 200 may provide the filtered 5 GHz signal to a network device. In some examples, switching device 200 may provide the filtered 5 GHz signal to the network device via first switch 210. Alternatively, in some examples, switching device 200 may provide the filtered 5 GHz signal to the network device via third switch 214. In some examples, switching device 200 may provide the filtered 5 GHz signal to first radio 130 of network device 100 via first switch 210. Alternatively, in some examples, switching device 200 may provide the filtered 5 GHz signal to first antenna 150 of network device 100 via third switch 214.

In the example of FIG. 2, switching device 200 may provide the filtered 6 GHz signal to a network device. In some examples, switching device 200 may provide the filtered 6 GHz signal to the network device via second switch 212. Alternatively, in some examples, switching device 200 may provide the filtered 6 GHz signal to the network device via fourth switch 216. In some examples, switching device 200 may provide the filtered 6 GHz signal to second radio 132 of network device 100 via second switch 212. Alternatively, in some examples, switching device 200 may provide the filtered 6 GHz signal to second antenna 152 of network device 100 via fourth switch 214.

In the example of FIG. 2, switching device 200 may prevent interference and jamming in a signal received by a network device from another signal generated by the network device that is in the vicinity of the received signal. For instance, when the network device receives a signal in the 5 GHz band and generates another signal in the 6 GHz band, switching device 200 may prevent interference in the received 5 GHz signal from the generated 6 GHz signal by applying the third filter 224 or fourth filter 226 to the generated 6 GHz signal. Moreover, switching device 200 may prevent jamming of the received 5 GHz signal from the generated 6 GHz signal by applying the first filter 220 or second filter 222 to the received 5 GHz signal. That is, by applying the first filter 220 or second filter 222 to the received 5 GHz signal, switching device 200 may prevent jamming of the received 5 GHz signal from the generated 6 GHz signal by filtering an undesired coupling of the generated 6 GHz signal to the received 5 GHz signal. Alternatively, when the network device receives a signal in the 6 GHz band and generates another signal in the 5 GHz band, switching device 200 may prevent interference in the received 6 GHz signal by applying the first filter 220 or second filter 222 to the generated 5 GHz signal. Moreover, switching device 200 may prevent jamming of the received 6 GHz signal from the generated 5 GHz signal by applying the third filter 224 or fourth filter 226 to the received 6 GHz signal. That is, by applying the third filter 224 or fourth filter 226 to the received 6 GHz signal, switching device 200 may prevent jamming of the received 6 GHz signal from the generated 5 GHz signal by filtering an undesired coupling of the generated 5 GHz signal to the received 6 GHz signal.

In this manner, the example switching device 200 of FIG. 2 may provide continuous 5 GHz and 6 GHz operation of a network device by selective filtering. For instance, switching device 200 may select first filter 220 or second filter 222 to be applied to the 5 GHz signal, wherein first filter 220 allows a lower frequency band to pass than second filter 222 in the 5 GHz band, select third filter 224 or fourth filter 226 to be applied to the 6 GHz signal, wherein third filter 224 allows a lower frequency band to pass than fourth filter 226 in the 6 GHz band, and apply the selected first filter 220 or second filter 222 to the 5 GHz signal and the selected third filter 224 or fourth filter 226 to the 6 GHz signal, thereby allowing a narrow transition gap (e.g., 200 MHz) to be maintained between Wi-Fi channels at or near an upper bounds of the 5 GHz band and a lower bounds of 6 GHz band during continuous 5 GHz and 6 GHz operation, while still achieving a minimum dB rejection (e.g., at least 50 dB) required to mitigate jamming and interference of received signals in such Wi-Fi channels. Thus, the selective filtering of the example switching device 200 of FIG. 2 may prevent de-sensitization and degradation of a received 5 GHz signal in the presence of a generated 6 GHz signal (or a received 6 GHz signal in the presence of a generated 5 GHz signal) by a network device across wider frequency band ranges in the 5 GHz and 6 GHz bands, and may allow greater channel availability and higher aggregated throughput for continuous 5 GHz and 6 GHz operation. In addition, the selective filtering of the example switching device 200 of FIG. 2 may allow more combinations of Wi-Fi channels in the 5 GHz and 6 GHz bands to be used during continuous 5 GHz and 6 GHz operation by a network device.

Figure 3:
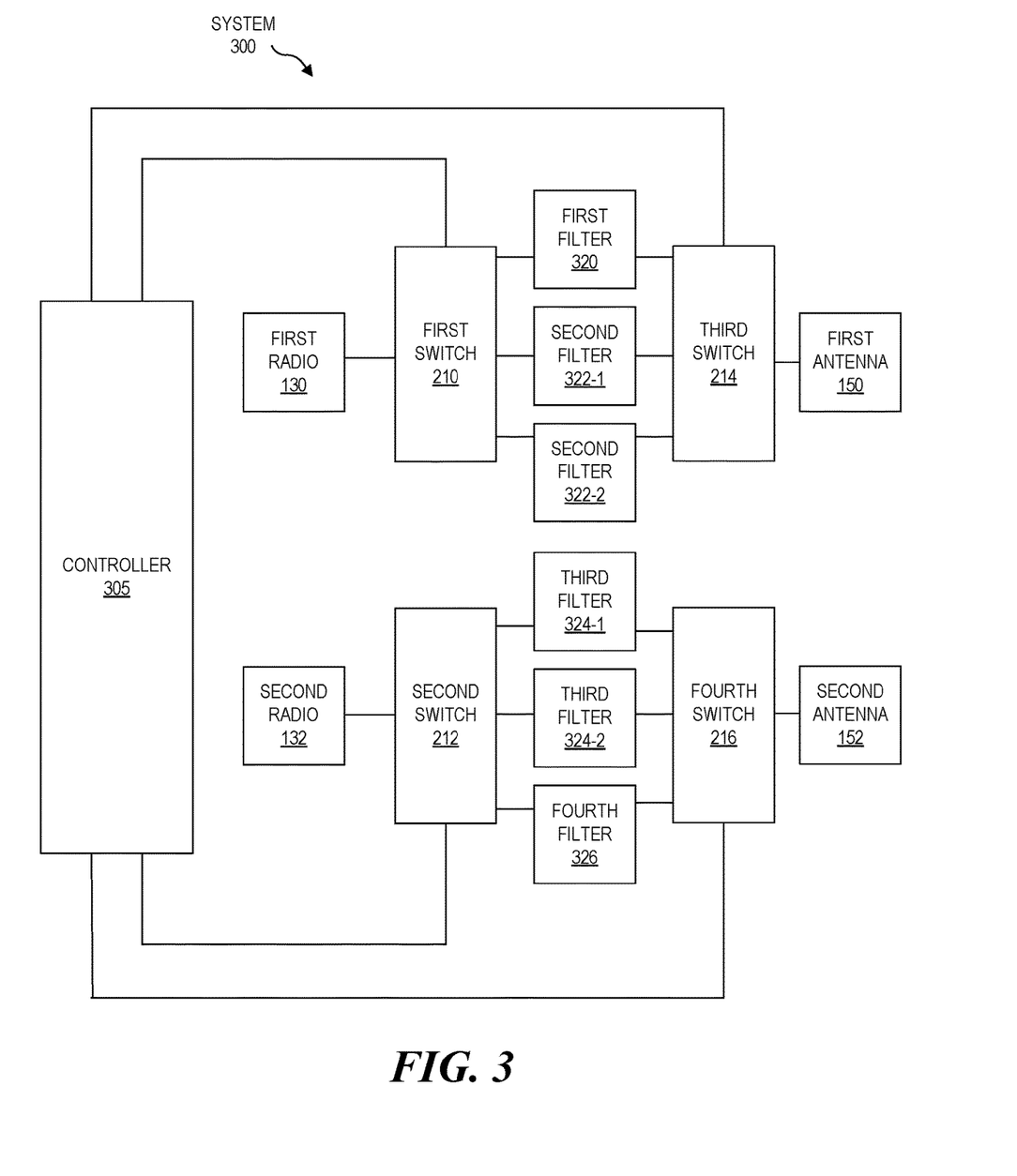
FIG. 3 is a block diagram of an example system 300 for continuous 5 GHz and 6 GHz operation by selective filtering.

FIG. 3 is a block diagram of an example system 300 for continuous 5 GHz and 6 GHz operation by selective filtering. System 300 includes a first radio 130, second radio 132, first antenna 150, and second antenna 152 as described above in relation to FIG. 1. In addition, system 300 includes first switch 210, second switch 212, third switch 214, and fourth switch 216 as described above in relation to FIG. 2. Moreover, system 300 includes first filter 320, second filters 322-1 and 322-2, third filters 324-1 and 324-2, and fourth filter 326. System 300 may comprise a network device (not shown) as described above in relation to FIG. 1. Moreover, system 300 may comprise a switching device (not shown) as described above in relation to FIG. 2.

In the example of FIG. 3, each of first, second, third, and fourth filters 320, 322-1, 322-2, 324-1, 324-2, and 326 may comprise a LTCC filter, a DR filter, a SAW filter, a BAW filter, or a combination thereof. For example, each of first filter 320, second filter 322-1, third filter 324-1, and fourth filter 326 may comprise a LTCC filter or a DR filter, and each of second filter 322-2 and third filter 324-2 may comprise a BAW filter.

In the example of FIG. 3, system 300 may be configured to select first filter 320 or one of second filters 322-1 and 322-2 to be applied to a 5 GHz signal, wherein each of first filter 320 allows a lower frequency band to pass than each of second filters 322-1 and 322-2 in the 5 GHz band. In some examples, first filter 320 or one of second filters 322-1 and 322-2 may be selected by first switch 210. Alternatively, in some examples, first filter 320 or one of second filters 322-1 and 322-2 may be selected by third switch 214. In some examples, the first filter 320 or one of second filters 322-1 and 322-2 may be selected in response to instructions received from controller 305. For instance, the instructions received from controller 305 may indicate a channel in the 5 GHz band which corresponds to one of the first filter 320, second filter 322-1, or second filter 322-2, and the first filter 320, second filter 322-1, or second filter 322-2 may be selected based on (e.g., in response to) the indicated channel.

In the example of FIG. 3, system 300 may be configured to select one of third filters 324-1 and 324-2 or fourth filter 326 to be applied to a 6 GHz signal, wherein each of third filters 324-1 and 324-2 allows a lower frequency band to pass than fourth filter 326 in the 6 GHz band. In some examples, one of third filters 324-1 and 324-2 or fourth filter 326 may be selected by second switch 212. Alternatively, in some examples, one of third filters 324-1 and 324-2 or fourth filter 326 may be selected by fourth switch 216. In some examples, one of third filters 324-1 and 324-2 or fourth filter 326 may be selected in response to instructions received from controller 305. For instance, the instructions received from controller 305 may indicate a channel in the 6 GHz band which corresponds to one of the third filter 324-1, third filter 324-2, or fourth filter 326, and the third filter 324-1, third filter 324-2, or fourth filter 326 may be selected based on (e.g., in response to) the indicated channel.

In some examples, first filter 320 may allow a frequency band in the range of 5150 to X MHz to pass, and each of second filters 322-1 and 322-2 may allow a frequency band in the range of X to 5895 MHz to pass, wherein X is a frequency between 5150 and 5895 MHz. For instance, X may be selected to satisfy Equations (1) and (2) above. In some examples, each of third filters 324-1 and 324-2 may allow a frequency band in the range of 5945 to Y MHz to pass, and fourth filter 326 may allow a frequency band in the range of Y to 7125 MHz to pass, wherein Y is a frequency between 5945 to 7125 MHz. For instance, Y may be selected to satisfy Equations (3) and (4) above.

In the example of FIG. 3, controller 305 of system 300 may be configured to provide a filtered 5 GHz signal to first radio 130 via first switch 210. Alternatively, in some examples, controller 305 of system 300 may provide a filtered 5 GHz signal to first antenna 150 via third switch 214. In the example of FIG. 3, controller 305 of system 300 may be configured to provide a filtered 6 GHz signal to second radio 132 via second switch 212. Alternatively, in some examples, controller 305 of system 300 may provide a filtered 6 GHz signal to second antenna 152 via fourth switch 216.

In the example of FIG. 3, controller 305 of system 300 may be configured to apply the selected first filter 320 or one of second filters 322-1 and 322-2 to a 5 GHz signal and the selected one of third filter 324-1 and 324-2 or fourth filter 326 to a 6 GHz signal. In some examples, each of second filters 322-1 and 322-2 may achieve different transition gaps and/or levels of dB rejection. For instance, second filter 322-1 may achieve at least a 50 dB rejection in a transition gap of 200 MHz, whereas second filter 322-2 may achieve at least a 50 dB rejection in a transition gap of 100 MHz. In some examples, each of third filters 324-1 and 324-2 may achieve different transition gaps and/or levels of dB rejection. For instance, third filter 324-1 may achieve at least a 50 dB rejection in a transition gap of 200 MHz, whereas third filter 324-2 may achieve at least a 50 dB rejection in a transition gap of 100 MHz.

In this manner, the example system 300 of FIG. 3 may provide continuous 5 GHz and 6 GHz operation by selective filtering. For instance, system 300 may select first filter 220 or one of second filters 322-1 and 322-2 to be applied to a 5 GHz signal, wherein first filter 320 allows a lower frequency band to pass than each of second filters 322-1 and 322-2 in the 5 GHz band, select one of third filters 324-1 and 324-2 or fourth filter 326 to be applied to a 6 GHz signal, wherein each of third filters 324-1 and 324-2 allows a lower frequency band to pass than fourth filter 226 in the 6 GHz band, and apply the selected first filter 320, second filter 322-1, or second filter 322-2 to the 5 GHz signal and the selected third filter 324-1, third filter 324-2, or fourth filter 326 to the 6 GHz signal, thereby allowing a narrow transition gap (e.g., 200 MHz, 100 MHz, etc.) to be maintained between Wi-Fi channels at or near an upper bounds of the 5 GHz band and a lower bounds of 6 GHz band during continuous 5 GHz and 6 GHz operation, while still achieving a minimum dB rejection (e.g., at least 50 dB) required to mitigate jamming and interference of received signals in such Wi-Fi channels. Thus, the selective filtering of the example system 300 of FIG. 3 may prevent de-sensitization and degradation of a received 5 GHz signal in the presence of a generated 6 GHz signal (or a received 6 GHz signal in the presence of a generated 5 GHz signal) by a network device across wider frequency band ranges in the 5 GHz and 6 GHz bands, and may allow greater channel availability and higher aggregated throughput for continuous 5 GHz and 6 GHz operation. In addition, the selective filtering of the example system 300 of FIG. 1 may allow more combinations of Wi-Fi channels in the 5 GHz and 6 GHz bands to be used during continuous 5 GHz and 6 GHz operation. Moreover, system 300 may comprise two second filters 322-1 and 322-2 that provide different transition gaps and/or levels of dB rejection and two third filters 324-1 and 324-2 that provide different transition gaps and/or levels of dB rejection, thereby providing flexibility in design of system 300 to provide various types of filtering between Wi-Fi channels at or near an upper bounds of the 5 GHz band and a lower bounds of 6 GHz band during continuous 5 GHz and 6 GHz operation.

Figure 4:
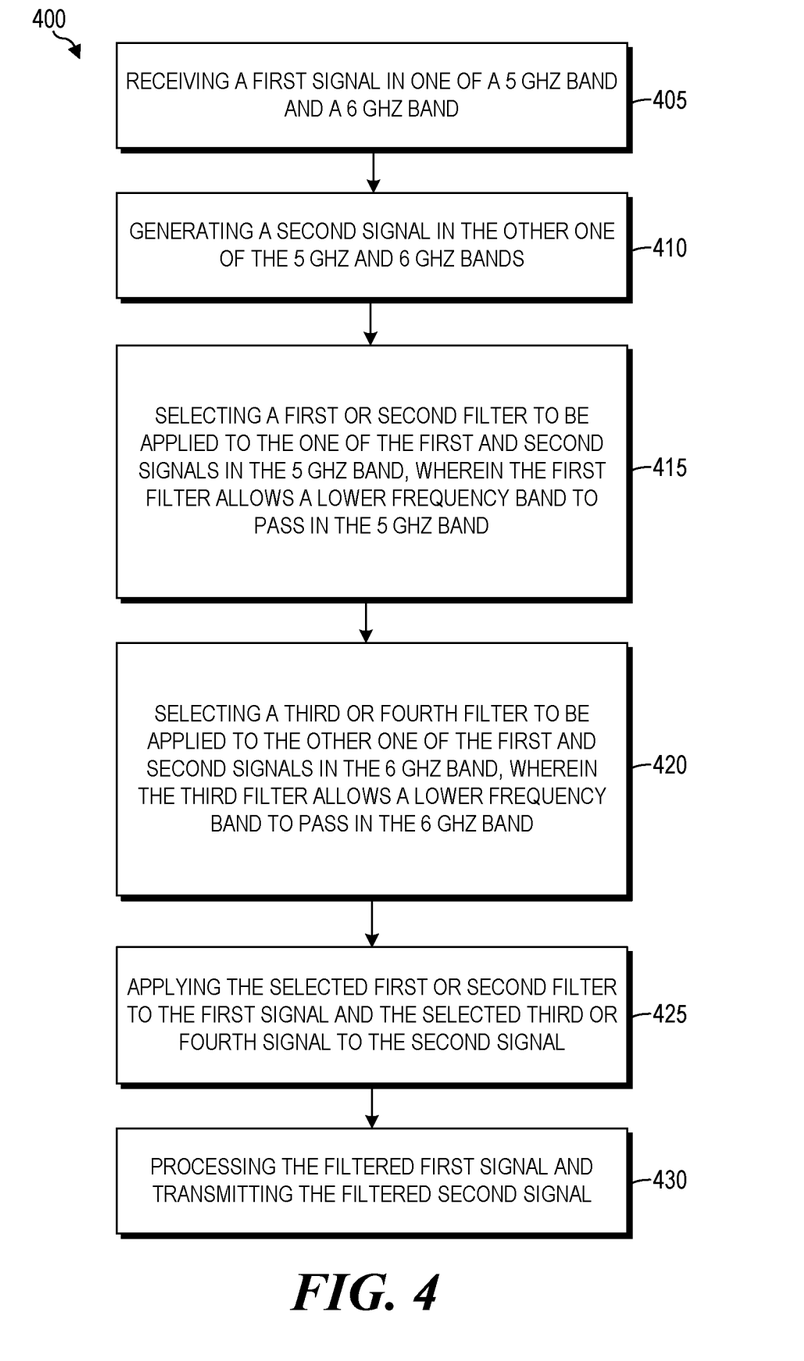
FIG. 4 shows an example functionality 400 of a network device for continuous 5 GHz and 6 GHz operation by selective filtering.

FIG. 4 shows an example functionality 400 of a network device for continuous 5 GHz and 6 GHz operation by selective filtering. Functionality 400 may be implemented as a method or may be executed as one or more instructions on a machine (e.g., by at least one processor), where the one or more instructions are included on at least one machine-readable storage medium (e.g., a non-transitory machine readable-storage medium.) While only six blocks are shown in functionality 400, functionality 400 may include other actions described herein. Additionally, although the blocks are shown in an order, blocks depicted in FIG. 4 may be performed in any order and at any time. Also, some of the blocks shown in functionality 400 may be omitted without departing from the spirit and scope of this disclosure. Functionality 400 may be implemented on a network device according to any of the examples herein.

As shown in block 405, functionality 400 may include receiving, by the network device, a first signal in one of a 5 GHz band and a 6 GHz band. In some examples, the first signal may be received by a first antenna of the network device.

As shown in block 410, functionality 400 may include generating, by the network device, a second signal in the other one of the 5 GHz and 6 GHz bands. In some examples, the second signal may be generated by a second radio of the network device, wherein the second radio operates at the other one of the 5 GHz and 6 GHz bands.

As shown in block 415, functionality 300 may include selecting, by the network device, a first filter or a second filter to be applied to the one of the first and second signals in the 5 GHz band, wherein the first filter allows a lower frequency band to pass than the second filter in the 5 GHz band. In some examples, the first or second filter may be selected by a switching device of the network device. In some examples, the first or second filter may be selected by a first switch of the network device. In some examples, the first or second filter may be selected based on (e.g., in response to) instructions received by the network device from a controller device. For instance, the instructions received by the network device from the controller device may indicate a channel in the 5 GHz band which corresponds to one of the first or second filters, and the first or second filter may be selected in response to the indicated channel.

As shown in block 420, functionality 400 may include selecting, by the network device, a third filter or a fourth filter to be applied to the other one of the first and second signals in the 6 GHz band, wherein the third filter allows a lower frequency band to pass than the fourth filter in the 6 GHz band. In some examples, the third of fourth filter may be selected by a switching device of the network device. In some examples, third or fourth filter may be selected by a second switch of the network device. In some examples, the third or fourth filter may be selected based on (e.g., in response to) instructions received by the network device from a controller device. For instance, the instructions received by the network device from the controller device may indicate a channel in the 6 GHz band which corresponds to one of the third or fourth filters, and the third or fourth filter may be selected in response to the indicated channel.

In some examples, the first filter allows a frequency band in the range of 5150 to X MHz to pass, and the second filter allows a frequency band in the range of X to 5895 MHz to pass, wherein X is a frequency between 5150 to 5895 MHz. For instance, X may be selected to satisfy Equations (1) and (2) above. In some examples, the third filter allows a frequency band in the range of 5945 to Y MHz to pass, and the fourth filter allows a frequency band in the range of Y to 7125 MHz to pass, wherein Y is a frequency between 5945 to 7125 MHz. For instance, Y may be selected to satisfy Equations (3) and (4) above.

As shown in block 425, functionality 400 may include applying, by the network device, the selected first or second filter to the first signal and the selected third or fourth filter to the second signal. In some examples, the selected first or second filter may be applied to the first signal by a switching device of the network device, and the selected third or fourth filter may be applied to the second signal by the switching device of the network device. In some examples, the second filter achieves at least a 50 dB rejection in a transition gap of 200 MHz. In some examples, the third filter achieves at least a 50 dB rejection in a transition gap of 200 MHz.

Example functionality 400 of a network device may prevent interference and jamming in a first signal received by the network device from a second signal generated by the network device that is in the vicinity of the first signal. For instance, when the network device receives a first signal in the 5 GHz band and generates a second signal is in the 6 GHz band, functionality 400 may prevent interference in the received 5 GHz signal from the generated 6 GHz signal by applying the third or fourth filter to the generated 6 GHz signal. Moreover, functionality 400 may prevent jamming of the received 5 GHz signal from the generated 6 GHz signal by applying the first or second filter to the received 5 GHz signal. That is, by applying the first or second filter to the received 5 GHz signal, functionality 400 may prevent jamming of the received 5 GHz signal from the generated 6 GHz signal by filtering an undesired coupling of the generated 6 GHz signal to the received 5 GHz signal. Alternatively, when the network device receives a first signal in the 6 GHz band and generates a second signal in the 5 GHz band, functionality 400 may prevent interference in the received 6 GHz signal by applying the first or second filter to the generated 5 GHz signal. Moreover, functionality 400 may prevent jamming of the received 6 GHz signal from the generated 5 GHz signal by applying the third or fourth filter to the received 6 GHz signal. That is, by applying the third or fourth filter to the received 6 GHz signal, functionality 400 may prevent jamming of the received 6 GHz signal from the generated 5 GHz signal by filtering an undesired coupling of the generated 5 GHz signal to the received 6 GHz signal.

As shown in block 430, functionality 430 may include processing the filtered first signal and transmitting the filtered second signal. In some examples, a first radio of the network device may process the filtered first signal. In some examples, a second antenna of the network device may transmit the filtered second signal. In some examples, the filtered first signal may be selected for processing by the network device via a third switch. In some examples, the filtered second signal may be selected for transmission by the network device via a fourth switch.

In this manner, example functionality 400 of FIG. 4 may provide continuous 5 GHz and 6 GHz operation of a network device by selective filtering. For instance, functionality 400 may include selecting a first filter or a second filter to be applied to a signal in the 5 GHz band, wherein the first filter allows a lower frequency band to pass than the second filter in the 5 GHz, selecting a third filter or a fourth filter to be applied to another signal in the 6 GHz band, wherein the third filter allows a lower frequency band to pass than the fourth filter in the 6 GHz band, and applying the selected first or second filter to the signal in the 5 GHz band and the selected third or fourth filter to the signal in the 6 GHz band, thereby allowing a narrow transition gap (e.g., 200 MHz) to be maintained between Wi-Fi channels at or near an upper bound of the 5 GHz band and a lower bound of the 6 GHz band during continuous 5 GHz and 6 GHz operation, while still achieving a minimum dB rejection (e.g., at least 50 dB) required to mitigate jamming and interference of received signals in such Wi-Fi channels. Thus, the selective filtering of the example functionality 400 of FIG. 4 may prevent de-sensitization and degradation of a received 5 GHz signal in the presence of a generated 6 GHz signal (or a received 6 GHz signal in the presence of a generated 5 GHz signal) by a network device across wider frequency band ranges in the 5 GHz and 6 GHz bands, and may allow greater channel availability and higher aggregated throughput for continuous 5 GHz and 6 GHz operation of the network device. In addition, the selective filtering of the example functionality 400 of FIG. 4 may allow more combinations of Wi-Fi channels in the 5 GHz and 6 GHz bands to be used during continuous 5 GHz and 6 GHz operation by a network device.

Figure 5:
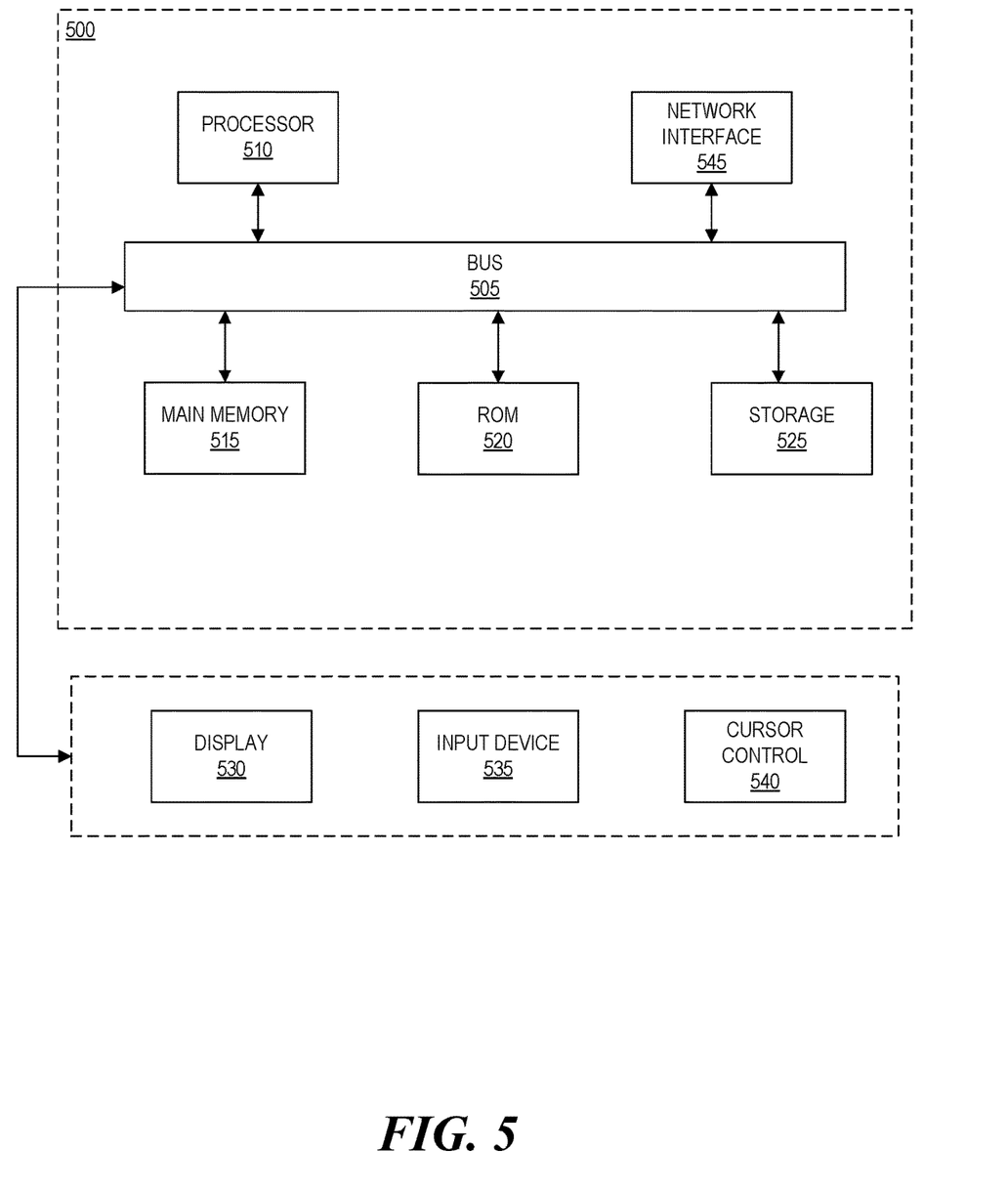
FIG. 5 is a block diagram of an example computer system 500 in which various embodiments described herein for continuous 5 GHz and 6 GHz operation by selective filtering may be implemented.

FIG. 5 is a block diagram of an example computer system 500 in which various embodiments described herein may be implemented for continuous 5 GHz and 6 GHZ operation by selective filtering.

Computer system 500 includes bus 505 or other communication mechanism for communicating information, at least one hardware processor 510 coupled with bus 505 for processing information. At least one hardware processor 510 may be, for example, at least one general purpose microprocessor.

Computer system 500 also includes main memory 515, such as random access memory (RAM), cache, other dynamic storage devices, or the like, or a combination thereof, coupled to bus 505 for storing information and one or more instructions to be executed by at least one processor 510. Main memory 515 also may be used for storing temporary variables or other intermediate information during execution of one or more instructions to be executed by at least one processor 510. Such one or more instructions, when stored on storage media accessible to at least one processor 510, render computer system 500 into a special-purpose machine that is customized to perform the operations specified in the one or more instructions.

Computer system 500 may further include read only memory (ROM) 520 or other static storage device coupled to bus 505 for storing static of one or more instructions to be executed by at least one processor 510. Such one or more instructions, when stored on storage media accessible to at least one processor 510, render computer system 500 into a special-purpose machine that is customized to perform the operations specified in the one or more instructions.

Computer system 500 may further include information and one or more instructions for at least one processor 510. At least one storage device 525, such as a magnetic disk, optical disk, or USB thumb drive (Flash drive), or the like, or a combination thereof, may be provided and coupled to bus 505 for storing information and one or more instructions.

Computer system 500 may further include display 530 coupled to bus 505 for displaying a graphical output to a user. The computer system 500 may further include input device 535, such as a keyboard, camera, microphone, or the like, or a combination thereof, coupled to bus 505 for providing an input from a user. Computer system 500 may further include cursor control 540, such as a mouse, pointer, stylus, or the like, or a combination thereof, coupled to bus 505 for providing an input from a user.

Computer system 500 may further includes at least one network interface 545, such as a network interface controller (NIC), network adapter, or the like, or a combination thereof, coupled to bus 505 for connecting computer system 500 to at least one network.

In general, the word "component," "system," "database," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked based on (e.g., in response to) detected events or interrupts. Software components configured for execution on computing devices may be provided on a computer readable medium, such as a compact disc, digital video disc, flash drive, magnetic disc, or any other tangible medium, or as a digital download (and may be originally stored on a compressed or installable format that requires installation, decompression or decryption prior to execution.) Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

Computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques herein are performed by computer system 500 based on (e.g., in response to) at least one processor 510 executing one or more sequences of one or more instructions contained in main memory 515. Such one or more instructions may be read into main memory 515 from another storage medium, such as at least one storage device 525. Execution of the sequences of one or more instructions contained in main memory 515 causes at least one processor 510 to perform the process steps described herein. In alternative embodiments, hard-wired circuitry may be used in place of or in combination with software instructions.

In examples described herein, the term "Wi-Fi" is meant to encompass any type of wireless communications that conforms to any IEEE 802.11 standards, whether 802.11ac, 802.11ax, 802.11a, 802.11 n, etc. The term "Wi-Fi" is currently promulgated by the Wi-Fi Alliance®. Any products tested and approved as "Wi-Fi Certified" (a registered trademark) by the Wi-Fi Alliance® are certified as interoperable with each other, even if they are from different manufacturers. A user with a "Wi-Fi Certified" (a registered trademark) product can use any brand of WAP with any other brand of client hardware that also is certified. Typically, however, any Wi-Fi product using the same radio frequency band (e.g., 5 GHz band for 802.11ac) will work with any other, even if such products are not "Wi-Fi Certified." The term "Wi-Fi" is further intended to encompass future versions and/or variations on the foregoing communication standards. Each of the foregoing standards is hereby incorporated by reference.

In examples described herein, "throughput" refers to a rate of successful data transmission across a communication link (e.g., a wireless link). Throughput may depend on a bandwidth of the communication link, a maximum rate of data transmission (i.e., peak data rate or peak bit rate) across the communication link, or a combination thereof. Moreover, throughput may depend on an amount of data packet loss during data transmission across the communication link. For example, a network device may increase throughput, and thereby improve performance, by increasing bandwidth of a communication link, reducing data packet loss during data transmission across the communication link, or a combination thereof. The throughput of a wireless link may be diminished by degradation of signal quality of wireless signals transmitted and/or received to establish the wireless link.

In examples described herein, "coverage range" refers to a maximum distance at which there is successful data transmission across a wireless link, even if throughput of such data transmission is low. The coverage range of a wireless link may be diminished by de-sensitization of wireless signals transmitted and/or received to establish the wireless link.

In examples described herein, the term "non-transitory media," and similar terms, refers to any electronic, magnetic, optical, or other physical storage device that contains or stores executable instructions. Non-transitory media may comprise non-volatile media and/or volatile media. Non-volatile media includes, for example, optical or magnetic disks. Volatile media includes, for example, dynamic memory. Common forms of non-transitory machine-readable media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics. Transmission media can also take the form of acoustic or light waves, such as those generated during radio-wave and infra-red data communications.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. As examples of the foregoing, the term "including" should be read as meaning "including, without limitation" or the like. The term "example" is used to provide exemplary instances of the item in discussion, not an exhaustive or limiting list thereof. The terms "a" or "an" should be read as meaning "at least one," "one or more" or the like. The presence of broadening words and phrases such as "one or more," "at least," "but not limited to" or other like phrases in some instances shall not be read to mean that the narrower case is intended or required in instances where such broadening phrases may be absent.

While the present techniques may be susceptible to various modifications and alternative forms, the examples discussed above have been shown only by way of example. It is to be understood that the techniques are not intended to be limited to the particular examples disclosed herein. Indeed, the present techniques include all alternatives, modifications, and equivalents falling within the true spirit and scope of the appended claims.

What is claimed is:

1. A method for continuous 5 GHz and 6 GHz operation by a network device, comprising:
   receiving, by the network device, a first signal in a 5 GHz band;
   generating, by the network device, a second signal in a 6 GHz band;
   selecting, by the network device, a first filter or a second filter to be applied the first signal in the 5 GHz band, wherein the first filter allows a lower frequency band to pass than the second filter in the 5 GHz band;
   selecting, by the network device, a third filter or a fourth filter to be applied to the second signal in the 6 GHz band, wherein the third filter allows a lower frequency band to pass than the fourth filter in the 6 GHz band, and wherein the third filter achieves at least a 50 dB rejection in a transition gap of 200 MHz; and
   simultaneously applying, by the network device, the selected first or second filter to the first signal and the selected third or fourth filter to the second signal.

2. The method of claim 1, wherein each of the first, second, third, and fourth filters comprises a low temperature co-fired ceramic (LTCC) filter, a dielectric resonator (DR) filter, a bulk acoustic wave (BAW) filter, or a combination thereof.

3. The method of claim 1, further comprising:
   transmitting, by the network device, the filtered second signal.

4. The method of claim 1, wherein receiving the first signal and generating the second signal further comprises:
   receiving, by a first antenna connected to a first radio operating at the 5 GHz band, the first signal; and
   generating, by a second radio operating at the 6 GHz band and connected to a second antenna, the second signal.

5. The method of claim 4, further comprising:
   processing, by the first radio, the filtered first signal; and
   transmitting, by the second antenna, the filtered second signal.

6. The method of claim 1, wherein the first filter allows a first frequency band in the range of 5150 to X MHz to pass, and the second filter allows a second frequency band in the range of X to 5895 MHz to pass, wherein X is a frequency between 5150 to 5895 MHz.

7. The method of claim 1, wherein the third filter allows a third frequency band in the range of 5945 to Y MHz to pass, and the fourth filter allows a fourth frequency band in the range of Y to 7125 MHz to pass, wherein Y is a frequency between 5945 to 7125 MHz.

8. The method of claim 1, wherein the second filter achieves at least a 50 dB rejection in a transition gap of 200 MHz.

9. A network device for continuous 5 GHz and 6 GHz operation, comprising:
   a processing resource; and
   a non-transitory machine-readable storage medium comprising instructions executable by the processing resource to:
      receive a first signal in a 5 GHz band;
      generate a second signal in a 6 GHz band;
      select a first filter or a second filter to be applied to the first signal in the 5 GHz band, wherein the first filter allows a lower frequency band to pass than the second filter in the 5 GHz band;
      select a third filter or a fourth filter to be applied to the second signal in the 6 GHz band, wherein the third filter allows a lower frequency band to pass than the fourth filter in the 6 GHz band, and wherein the third filter achieves at least a 50 dB rejection in a transition gap of 200 MHz; and
      simultaneously apply the selected first or second filter to the first signal and the selected third or fourth filter to the second signal.

10. A network device of claim 9, further comprising:
    a first radio operating at the 5 GHz band and connected to a first antenna;
    a second radio operating at the 6 GHz band and connected to a second antenna; and
    wherein the instructions to receive the first signal and to generate the second signal comprise instructions executable by the processing resource to:
       receive, by the first antenna, the first signal; and
       generate, by the second radio, the second signal.

11. A network device of claim 10, wherein the instructions comprise instructions executable by the processing resource to:
    process, by the first radio, the filtered first signal; and
    transmit, by the second antenna, the filtered second signal.

12. A network device of claim 9, further comprising:
    a switching device; and
    wherein the instructions to select the first or second filter, select the third or fourth filter, and simultaneously apply the selected first and second filter and the selected third or fourth filter comprise instructions executable by the processing resource to:
       select, by the switching device, the first or second filter to be applied to the first signal;

select, by the switching device, the third or fourth filter to be applied to the second signal; and apply, by the switching device, the selected first or second filter to the first signal and the selected third or fourth filter to the second signal.

13. A network device of claim 9, further comprising:
a first switch, a second switch, a third switch, and a fourth switch; and
wherein the instructions to select the first or second filter and select the third or fourth filter, and apply the selected first and second filter and the selected third or fourth filter comprise instructions executable by the processing resource to:
  select, by the first switch, the first or second filter to be applied to the first signal;
  select, by the second switch, the third or fourth filter to be applied to the second signal; and
  select, by third switch, the filtered first signal; and
  select, by the fourth switch, the filtered second signal.

14. The network device of claim 9, wherein the first filter allows a first frequency band in the range of 5150 to X MHz to pass, and the second filter allows a second frequency band in the range of X to 5895 MHz to pass, wherein X is a frequency between 5150 to 5895 MHz.

15. The network device of claim 9, wherein the third filter allows a third frequency band in the range of 5945 to Y MHz to pass, and the fourth filter allows a fourth frequency band in the range of Y to 7125 MHz to pass, wherein Y is a frequency between 5945 to 7125 MHz.

16. The network device of claim 9, wherein the second filter achieves at least a 50 dB rejection in a transition gap of 200 MHz.

17. An article comprising at least one non-transitory machine-readable storage medium comprising instructions executable by the at least one processing resource of a network device to:
  receive a first signal in a 5 GHz band;
  generate a second signal in a 6 GHz band;
  select a first filter or a second filter to be applied to the first signal in the 5 GHz band, wherein the first filter allows a lower frequency band to pass than the second filter in the 5 GHz band;
  select a third filter or a fourth filter to be applied to the second signal in the 6 GHz band, wherein the third filter allows a lower frequency band to pass than the fourth filter in the 6 GHz band, and wherein the third filter achieves at least a 50 dB rejection in a transition gap of 200 MHz; and
  apply the selected first or second filter to the first signal and the selected third or fourth filter to the second signal.

18. The article of claim 17, wherein the first filter allows a first frequency band in the range of 5150 to X MHz to pass, and the second filter allows a second frequency band in the range of X to 5895 MHz to pass, wherein X is a frequency between 5150 to 5895 MHz, and the third filter allows a third frequency band in the range of 5945 to Y MHz to pass, and the fourth filter allows a fourth frequency band in the range of Y to 7125 MHz to pass, wherein Y is a frequency between 5945 to 7125 MHz.

19. The article of claim 17, wherein the second filter achieves at least a 50 dB rejection in a transition gap of 200 MHz.

* * * * *